(12) United States Patent
Saado

(10) Patent No.: US 6,891,765 B2
(45) Date of Patent: May 10, 2005

(54) CIRCUIT AND/OR METHOD FOR IMPLEMENTING A PATCH MECHANISM FOR EMBEDDED PROGRAM ROM

(75) Inventor: Alon Saado, San Diego, CA (US)

(73) Assignee: Via Telecom, Inc., San Diego, CA (US)

( * ) Notice: Subject to any disclaimer, the term of this patent is extended or adjusted under 35 U.S.C. 154(b) by 0 days.

(21) Appl. No.: 10/634,669

(22) Filed: Aug. 5, 2003

(65) Prior Publication Data

US 2005/0030796 A1 Feb. 10, 2005

(51) Int. Cl.[7] .............................. G11C 29/00; G11C 7/00
(52) U.S. Cl. .................. 365/200; 365/189.07; 711/102; 711/154; 711/163; 714/710
(58) Field of Search ........................ 365/200 O, 189.07, 365/230.01; 711/154, 102, 165; 714/710

(56) References Cited

U.S. PATENT DOCUMENTS

| | | | |
|---|---|---|---|
| 4,610,000 A | | 9/1986 | Lee ............................ 365/189 |
| 6,158,018 A | * | 12/2000 | Bernasconi et al. ........... 714/8 |
| 6,421,283 B1 | * | 7/2002 | Walley et al. .............. 365/200 |
| 6,438,664 B1 | * | 8/2002 | McGrath et al. ............ 711/154 |
| 2003/0051119 A1 | * | 3/2003 | Li et al. ...................... 711/210 |

FOREIGN PATENT DOCUMENTS

GB 2373888 A * 10/2002 ........... G06F/11/36

* cited by examiner

Primary Examiner—VanThu Nguyen
(74) Attorney, Agent, or Firm—Christopher P. Maiorana, PC

(57) ABSTRACT

The present invention concerns an apparatus comprising a memory, a logic circuit and a multiplexer. The memory generally comprises a first address space configured as read only and a second address space configured as read and write. The memory returns a first data item in response to a first address within the first address space. The logic circuit may be configured to (i) deassert a command signal in response to the first address not matching any of a plurality of predetermined addresses and (ii) generate a first branch instruction and assert the command signal in response to the first address matching one of the predetermined addresses in response to the matching. The multiplexer may be configured to select the first data item from the memory or the first branch instruction from the logic circuit in response to the command signal.

19 Claims, 3 Drawing Sheets

CIRCUIT AND/OR METHOD FOR IMPLEMENTING A PATCH MECHANISM FOR EMBEDDED PROGRAM ROM

FIELD OF THE INVENTION

The present invention relates to embedded programs generally and, more particularly, to a circuit and/or method for implementing a patch mechanism for an embedded program ROM.

BACKGROUND OF THE INVENTION

Conventional digital signal processor (DSP) cores are implemented to execute instructions that are taken from a program memory. The program memory can be implemented as a random access memory. (RAM), a read only memory (ROM) or combination of RAM and ROM. The program data stored in ROM cannot be modified after initial programming.

Patch logic gives a programmer an option to "overwrite" part of the code in the ROM, and replace them with different instructions in order to fix bugs or enhance a particular feature. Patch logic is often implemented by redirecting the normal flow of the code to a patch code.

Conventional approaches, such as U.S. Pat. No. 4,610,000, implement patches that are directed to specific tasks such as patching macrocodes. Patching a program ROM of a core processor with a one to one patch does not take into account the core processor read operation timing and the instruction set.

It would be desirable to implement patching of program code by redirecting the normal flow of the code to fix bugs or add instructions to an existing code. It would also be desirable to implement such patching of code by redirecting the code to a patch RAM. Such a patch would be particularly useful in integrated circuit chips with an embedded program ROM.

SUMMARY OF THE INVENTION

The present invention concerns an apparatus comprising a memory, a logic circuit and a multiplexer. The memory generally comprises a first address space configured as read only and a second address space configured as read and write. The memory returns a first data item in response to a first address within the first address space. The logic circuit may be configured to (i) deassert a command signal in response to the first address not matching any of a plurality of predetermined addresses and (ii) generate a first branch instruction and assert the command signal in response to the first address matching one of the predetermined addresses in response to the matching. The multiplexer may be configured to select the first data item from the memory or the first branch instruction from the logic circuit in response to the command signal.

The objects, features and advantages of the present invention include providing circuit and/or method for implementing a patch mechanism for an embedded program (e.g., a ROM) that may (i) provide flexibility in patch location, program address space and patch size, (ii) be implemented while keeping a low gate count, (iii) provide flexibility to implement a number of patches, (iv) be implemented without restriction on the size of the patch code, (v) provide the patch code without being limited to a predefined code, (vi) be implemented without restrictions on the return address, and/or (vii) provide a comparison between consecutive addresses to ensure proper operation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may be implemented to provide a patch mechanism for an embedded program, such as a read only memory (ROM). The implementation may be efficient as far as gate count and may provide flexibility to an end user. The implementation may be optimized for particular digital signal processor (DSP) cores (e.g., TeakLite DSP core), but may be implemented in other DSP cores, processors, and/or subsystems to meet the design criteria of a particular implementation. The timing of the present invention may be adjusted to accommodate a particular processor core. The present invention may be implemented in the context of a patch mechanism in a DSP subsystem, but may also be implemented in other types of core circuits or modules that implement a program memory that may not be readily modified.

In general, a processor accesses a program ROM to read instructions. When instructions need to be replaced or added, a patch logic circuit may be used to redirect the normal flow of the code to a patch code. The redirecting is generally done by forcing a branch instruction to be read instead of the instruction in the program ROM.

Figure 1:
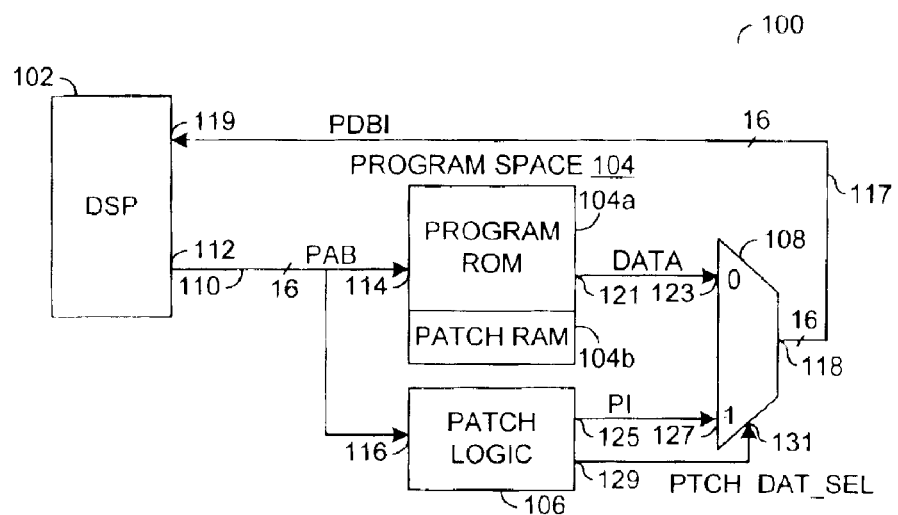
FIG. 1 is a block diagram of a preferred embodiment of the present invention.

Referring to FIG. 1, a circuit 100 is shown illustrating a preferred embodiment of the present invention. The circuit 100 generally comprises a processor 102, a program space circuit (or section) 104, a patch logic circuit (or section) 106, and a selection circuit (or section) 108. The processor 102 may be implemented as a digital signal processor or other processor appropriate to meet the design criteria of a particular implementation. The program circuit 104 may be implemented as a memory defining a memory space. The memory 104 may comprise a program memory (or section) 104a and a patch memory (or section) 104b. The program memory 104a may configured as a ROM type memory spanning a first address range of the memory space. The program memory 104b may be configured as a RAM type memory spanning a second address range of the memory space. The program memory 104a and the program memory 104b may be implemented as separate memories isolated from each other or as a single memory with a ROM portion and a RAM portion. The patch logic circuit 106 may be implemented within a DSP subsystem. The selection circuit 108 may be implemented as a multiplexer or other appropriate selection device.

An address bus 110 is generally connected between an output 112 of the processor 102 and (i) an input 114 of the program circuit 104 and (ii) an input 116 of the patch logic circuit 106. An address signal (e.g., PAB) may be generated by the processor 102 and received substantially simultaneously by both the program circuit 104 and the patch logic circuit 106. The address bus 110 is shown implemented as a 16-bit bus. However, other bus widths may be implemented to meet the design criteria of a particular implementation.

A data bus 117 is generally connected between an output 118 of the multiplexer 108 and an input 119 of the processor 102. A data signal (e.g., PDBI, program data bus in) may be returned from the selection circuit 108 to the processor 102. The data signal PDBI may carry a variety of data items such as, but not limited to, instructions, addresses and/or user data. The data bus 117 may be implemented as a 16-bit bus. However, other bus widths may be implemented to meet the design criteria of a particular implementation.

The memory 104 may present a signal (e.g.; DATA) at an output 121 to an input 123 of the multiplexer 108 responsive to the address PAB received at the input 114. The patch logic circuit 106 may generate a signal (e.g., PI) at an output 125 to an input 127 of the multiplexer 108 based upon a series of addresses PAB. The patch logic circuit 106 may also generate a select or control signal (e.g., PTCH_DAT_SEL) at an output 129 to a control input 131 of the multiplexer 108, also based upon the sequence of addresses PAB.

In general, either the program ROM 104a or the patch RAM 104b may be read in response to the particular address PAB presented on the address bus 110. The patch logic circuit 106 generally controls the multiplexer 108 and may force a branch instruction (opcode or command) potentially followed by a branch address. The branch address, which may be read from a register within the patch logic circuit 106 (to be described in more detail in connection with FIG. 2) generally comprises an address within the address range (or space) of the patch RAM 104b. Therefore, after executing the branch instruction, the processor 102 may execute one or more additional instructions from the patch RAM 104b. The instructions in the patch RAM 104b will generally include another branch instruction and an associated branch address back into the program ROM 104a.

Figure 2:
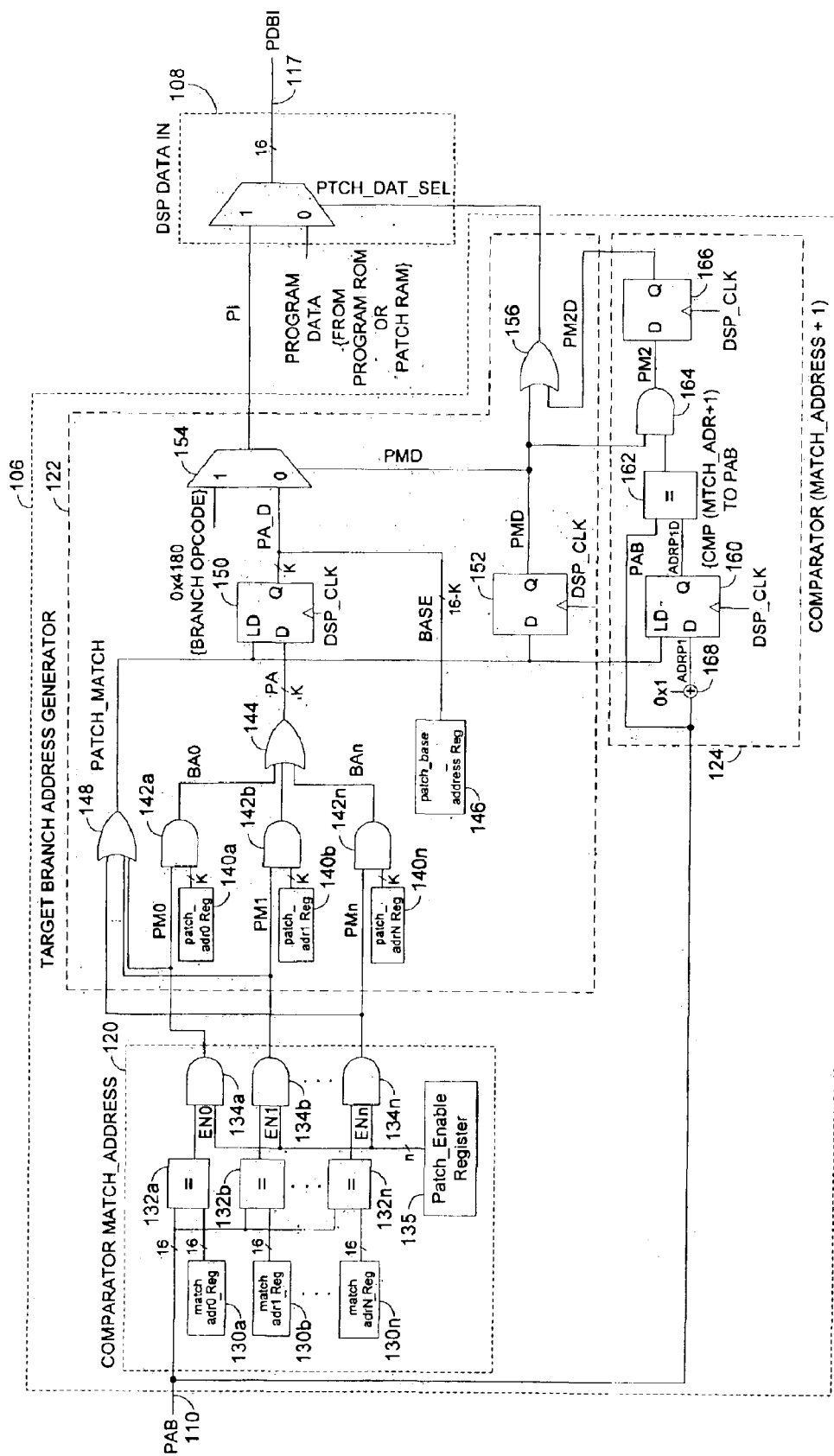
FIG. 2 is a more detailed diagram of the present invention.

Referring to FIG. 2, a more detailed diagram of the patch logic circuit 106 and the multiplexer 108 is shown. The patch logic circuit 106 generally comprises a block (or section) 120, a block (or section) 122 and a block (or section) 124. The block 120 may be implemented as a comparator match section. The block 122 may be implemented as a target branch address generator section. The block 124 may be implemented as a comparator sequence section.

The block 120 generally comprises a number of registers 130a–130n, a number of logic blocks 132a–132n and a number of gates 134a–134n. The address registers 130a–130n each may contain a predetermined address (which may be a first address of a particular portion of code) stored in the program ROM 104a that a programmer intends to replace. The predetermined addresses may indicate addresses for lines of code stored in the program ROM 104a being patched, repaired or expanded. Each of the logic blocks 132a–132n may be implemented as a comparator configured to generate a match signal (e.g., PM0–PMn) by comparing the address PAB with one of the predetermined addresses. Each of the gates 134a–134n may be implemented as a logical AND gate configured to enable/disable the match signals PM0–PMn.

The enable logic gates 134a–134n generally allow each of the patch registers 130a–130n to be enabled or disabled. Each of the enable logic gates 134a–134n has a first input that may receive a signal from one of the logic blocks 132a–132n and a second input that may receive one of a number of enable signals (e.g., EN0–ENn). The enable signals EN0–ENn may be received from a patch enable register 135 or may be externally generated. For example, the enable logic 134a generally receives an output from the logic block 132a and an enable signal EN0. Each patch has a designated bit in the patch enable register 135, or a dedicated external enable signal. A '1' in a specific bit will enable a particular patch. A '0' in a particular bit will disable the particular patch. During initialization, one or more of the match address registers 130a–130n may be programmed with a respective match address and the associated patch address registers 140a–140n may be programmed with a respective patch address. The particular patches to be enabled may be enabled through the enable signals EN0–ENn.

The block 122 generally comprises a number of registers 140a–140n, a number of gates 142a–142n, a gate 144, a register 146, a gate 148, a block 150, a block 152, a block 154 and a block 156. The registers 140a–140n may be implemented as patch address registers for storing branch addresses (e.g., BA0–BAn). The branch addresses BA0–BAn may provide the first addresses of a new portion of code within the patch RAM 104b that provides the replacement instructions. A program executed by the processor 102 may branch to a particular branch address BA0–BAn if a match between the program address PAB and a particular one of the match address registers 130a–130n occurs. The gates 142a–142n may be implemented as logical AND gates. The gates 142a–142n may assert/deassert the branch address BA0–BAn based on the respective match signals PM0–PMn.

The gate 144 and the gate 148 may be implemented as logical OR gates. The gate 144 may generate a current branch address (e.g., PA) from the asserted branch address of the branch addresses BA0–BAn. The gate 148 may generate a signal (e.g., PATCH_MATCH) based upon the match signals PM0–PMn.

The block 150 may be implemented as a D-type flip-flop with a load-enable capability. The flip-flop 150 may load the current branch address PA in response to an assertion of the signal PATCH_MATCH. The flip-flop 150 may present a stored version of the current branch address PA upon an edge (e.g., rising) of a clock signal (e.g., DSP_CLK). The register 146 may be implemented as a base address register for storing a base address (e.g., BASE) of the address range for the patch RAM 104b. The stored version of the branch address PA may be concatenated with the base address BASE to form a delayed branch address (e.g., PA_D) synchronized with the clock signal DSP_CLK.

The block 152 may be implemented as a D-type flip-flop. The flip-flop 152 may store the signal PATCH_MATCH on an edge (e.g., rising) of the clock signal DSP_CLK. The flip-flop 152 may present a signal (e.g., PMD) as a delayed version of the signal PATCH_MATCH synchronized to the clock signal DSP_CLK. The block 154 may be implemented as a multiplexer. The multiplexer 154 may multiplex a predetermined branch instruction (or opcode) (e.g., 0x4180) and the signal PA_D to generate the signal PI as controlled by the signal PMD.

The gate 156 may be implemented as a logical OR gate. The gate 156 may generate the control signal PTCH_DAT_SEL from the signal PMD and an indication signal (e.g., PM2D). While each of the circuit elements of the block 122 are shown illustrating specific implementations, each of the circuit elements of the block 122 may be modified accordingly to meet the design criteria of a particular implementation.

The block 124 generally comprises a block (or circuit) 160, a block (or circuit) 162, a block (or circuit) 164, a block (or circuit) 166 and a block (or circuit) 168. The block 160 may be implemented as a D-type flip-flop with a load-enable feature. The block 162 may be implemented as a comparator. The block 164 may be implemented as a logical AND gate. The block 166 may be implemented as a D-type flip-flop. The block 168 may be implemented as a multi-bit adder. Each of the flip-flops 160 and 166 may receive the clock signal DSP_CLK.

The adder 168 may generate an intermediate address (e.g., ADRP1) by adding a fixed value (e.g. 0x1) to the address PAB. The intermediate address ADRP1 may be equal to a consecutive address, from the address PAB currently on the address bus 110. The flip-flop 160 may store the intermediate address ADRP1 when loading is enabled by the asserted signal PATCH_MATCH. A delayed intermediate address (e.g., ADRP1D) may be presented by the flip-flop 160 upon an edge (e.g., rising) of the clock signal DSP_CLK. The comparator 162 may generate a result signal (e.g., PM2) based upon a comparison of the address PAB and the delayed intermediate address ADRP1D. The gate 164 may enable/disable the result signal PM2 using the signal PMD. The flip-flop 166 may store the enabled/disabled result signal PM2 on an edge (e.g., rising) of the clock signal DSP_CLK. The flip-flop 166 may presented the stored value of the signal PM2 as the indication signal PM2D. While each of the circuit elements of the block 124 are shown illustrating specific implementations, each of the circuit elements of the block 124 may be modified accordingly to meet the design criteria of a particular implementation.

When the processor 102 executes a code, the processor 102 presents a sequence of the addresses PAB on the address bus 110 and reads instruction items PDBI from the data bus 117. When an address PAB on the program address bus 110 matches an address in one of the match address registers 130a–130n, the patch logic 106 generally transmits a branch opcode (e.g., 0x4180 in case of the TeakLite DSP Core) instead of the data item (e.g., an opcode) from the program ROM 104a onto the data bus 117. In the next cycle, if there is a match between the next address PAB and the intermediate address ADRP1D (e.g., current address=match address+one unit step size) indicating consecutive addresses in the address space, the patch logic 106 may generate the branch address. PA_D instead of the next data item (e.g., another opcode or operand) from the program ROM 104a. The multiplexer 108 may be commanded to return the branch address PA_D to the processor 102 on the data bus 117 as the data signal PDBI. If the branch instruction generated by the patch logic circuit 106 is executed by the processor 102 and the running program branches to a new portion of the code in the patch RAM 104b, the new portion of the code may be executed by the processor 102. At the end of the patch code, another branch instruction and branch address may return the program to the main code in the program ROM 104a.

In general, all of the 16-bit addresses PAB may be compared to the predetermined addresses loaded into the match address registers 130a–130n. Therefore, there may be no restrictions for the predetermined address or the addresses PAB. Also, the patch address registers 140a–140n may be implemented as K-bit wide registers, where K is an integer less than a width of the address bus 110. The patch address registers 140a–140n generally include the lower bits (e.g., BA0–BAN) of the branch address PA_D. The size (e.g., K) of the patch address registers 140a–140n may be determined by the size of the patch RAM 104b. For example, in case of 1024×16 bit patch RAM 104b, the width K of the patch address registers 140a–140n may be 10 bits. An implementation storing less than all of the bits for the addresses PAB generally reduces the gate count in the patch logic circuit 106.

The higher bits of the branch address PA_D may be programmed in the register 146. Therefore, the programmer generally has flexibility of the location of the patch RAM 104b within the program address space of the DSP 102 and/or the address range of the program ROM 104a.

When there is a match between the address PAB on the address bus 110 and one of the match address registers 130a–130n, a match signal PM0–PMN generally transitions (or is asserted) to a logical HIGH state. The asserted match signal PM0–PMn may assert the signal PATCH_MATCH. Assertion of the signal PATCH_MATCH may load the target branch address (e.g., BA0–BAn) into the flip-flop 150 and the intermediate address ADRP1 into the flip-flop 160. The signal PATCH_MATCH may also be delayed (e.g., the delayed signal PMD) by one cycle to meet timing constraints of a particular core (e.g., TeakLite DSP Core). For example, a particular read address PAB may be supplied on the address bus 110 in one cycle of the clock signal DSP_CLK and the data PDBI may be captured by the processor 102 from the data bus 117 in the next cycle of the clock signal DSP_CLK.

In the next cycle, a branch opcode may be driven onto the data bus 117 to the DSP 102. The next value of the address PAB on the address bus 110 may also be compared to a value of the delayed intermediate address ADRP1D. If there is a match between the next address and the intermediate address values, the branch address PA_D may be driven onto the data bus 117 causing the program to branch to that address.

A return address is generally added at the end of the patch code to return to execute commands from the ROM 104a. The return address may be a consecutive address to the addresses in the registers 130a–130n (e.g., patching only one command). In such a case, the signal PATCH_MATCH may not transition to the logical HIGH state because the address PAB may not match any of the predetermined addresses stored in the registers 130a–130n. Therefore, the processor 102 may resume reading opcodes and operands taken from the program ROM 104a.

Figure 3:
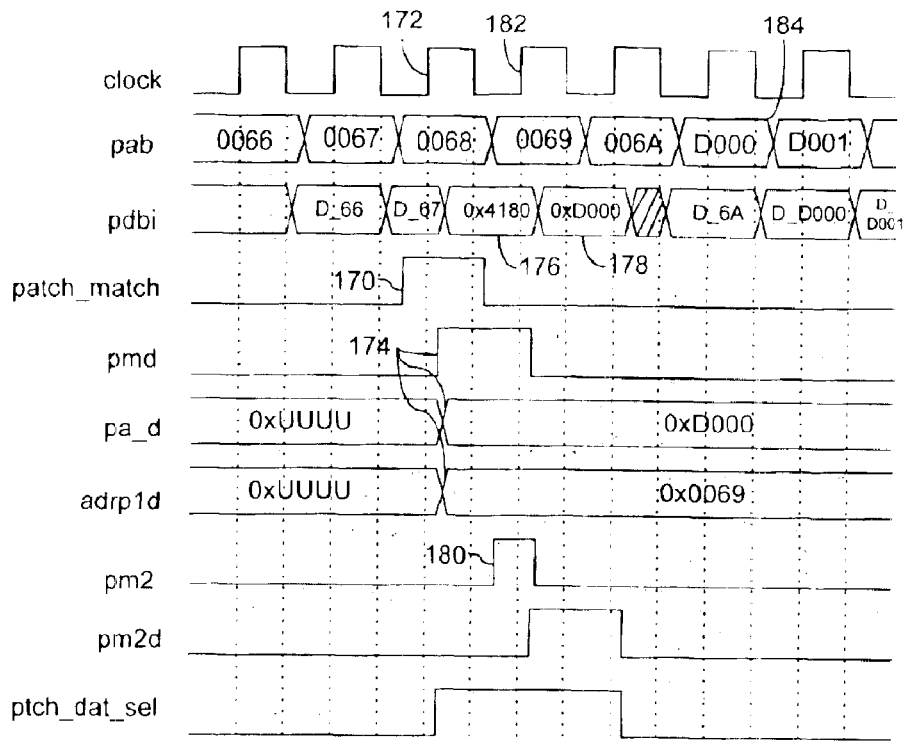
FIG. 3 is a timing diagram illustrating operation of the present invention.

Referring to FIG. 3, a timing diagram of various signals of the invention is shown. The predetermined address triggering a match in the example is illustrated as 0x0068. The target branch address within the patch RAM 104b is illustrated as 0xD000. When the address PAB on the address bus 110 is 0x0068, the signal PATCH_MATCH may transition 170 to the logical HIGH state. The patch logic circuit 106 may load the target branch address PA (e.g., 0XD000) into the flip-flop 150 and the intermediate address ADRP1 (e.g., 0x0069) into the flip-flop 160. The flip-flops 152, 150 and 160 may synchronize the signals PATCH_MATCH, PA and ADRP1 to an edge 172 of the clock DSP_CLK to update 174 the signals PMD, PA_D and ADRP1D. The multiplexer 154 may respond to the asserted signal PMD by routing the branch opcode. (e.g., 0x4180) to the multiplexer 108. The multiplexer 108 may respond to the asserted signal PMD, through the gate 156 to the control signal PTCH_DAT_SEL, to route the branch opcode to the processor 102 in the signal PDBI (176).

If the processor 102 outputs the address 0x0069 as the next address PAB, another match may be identified in the comparator sequence section 124 and the target branch address PA may be presented by the patch logic 106 in the signal PDBI (178). In the example, the comparator 162 may assert the signal PM2 gated through the gate 164 (180). The flip-flop 166 may present the delayed signal PM2D on a rising edge 182 of the clock signal DSP_CLK. The asserted signal PM2D may hold the control signal PTCH_DAT_SEL in the logical HIGH state while the target branch address 0xD000 is driven onto the data bus 117. After decoding the branch opcode 0x4180, the processor 102 may branch to the target branch address 0xD000 (184).

Figure 4:
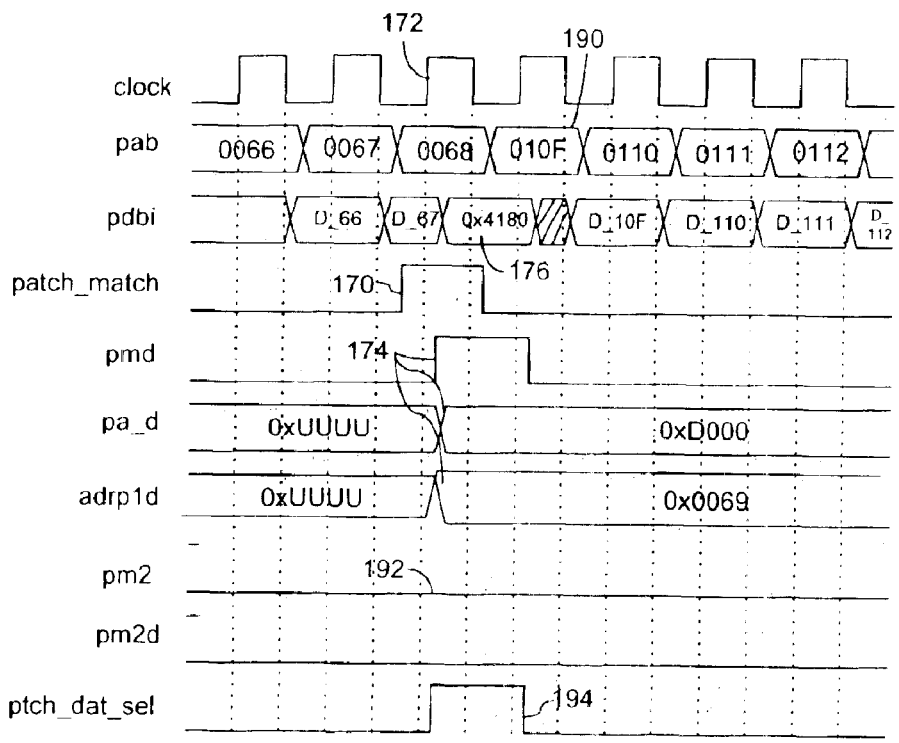
FIG. 4 is a timing diagram illustrating operation of the present invention.

Referring to FIG. 4, a diagram illustrating the timing in case the next address on the address bus 110 is not equal to the intermediate address. In such a case, the first opcode of the branch instruction (e.g., 0x4180) may be fetched (176) by the processor 102 but ignored. Instructions may continue to be read from the program ROM 104a at a non-sequential address 0x010F (190). As a result, the comparator 162 may not find a match between the next address (e.g., 0x010F) and the intermediate address ADRP1D (e.g., 0x0069). Therefore, the comparator 162 may leave (192) the signal PM2 in the logical LOW state. After the branch opcode has been read from the data bus 117, the control signal PTCH_DAT_SEL may be transitioned 194 to the logical LOW state causing the multiplexer 108 to route data items PI from the program ROM 104a.

The present invention provides flexibility in the patch RAM 104b location, the program address space and the patch RAM 104b size, while keeping a low gate count. The present invention also provides flexibility for the number of patches implemented. No restrictions generally exist on the size of the patch code other than the capacity of the patch RAM 104b. After branching to the patch code, the processor 102 may start executing instructions taken from the patch RAM 104b. At the end of each patch code, there may be a branch command and a branch address to an instruction stored in the program ROM 104a. Since the patch code may be in a RAM, there may be flexibility regarding the content of the patch code itself. Furthermore, there may be no restrictions on the return addresses to the program ROM 104a. In one example, the consecutive address of the match address may be the return address. Therefore, even a single instruction in the program ROM. 104a may be patched.

Comparison of the next address (e.g., matching address+1) before presenting the branch address on the data bus 117 generally prevents undesired behavior. There may be cases that the next address after a matching address is not one incremental step through the address space because of a pipeline mechanism of the processor 102. For example, patching after a conditional branch command may cause a significant change in the next address relative to the matching address. If the conditional branch is executed, the matching address may be on the address bus 117' (e.g., as part of a fetch stage), but the next address should not be the consecutive address (e.g., matching address+1). Therefore, branching to the code stored in the patch RAM 104b should not happen. Watching for consecutive addresses between the matching address and the next address generally ensures a proper operation. In general, the present invention will avoid patching an address of a second part of a two word instruction. Such a case may cause decoding of the first part of the instruction, but may decode a branch opcode as the second part, which may cause unknown behavior.

The present invention may be implemented as part of a code division multiple access (CDMA) system utilizing high performance DSPs executing instructions from a program ROM/RAM. The programming flexibility provided by the RAM memory space may allow updates to the programming as new communications standards evolve. Applications for existing standards, such as the third-generation (3G) CDMA2000® (a registered trademark of Telecommunications Industry Association, Arlington, Va.) Release 0 solution, may also benefit from the programming flexibility as new features and capabilities may be added.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a memory comprising a first address space configured as read only and a second address space configured as read and write, wherein said memory returns a first data item in response to a first address within said first address space;
   a logic circuit configured to (i) deassert a command signal in response to said first address not matching any of a plurality of predetermined addresses and (ii) generate a first branch instruction and assert said command signal in response to said first address matching one of said predetermined addresses in response to said matching, wherein said logic circuit is further configured to generate a first branch address within said second address space and assert said command signal in response to a second address (i) immediately following said first address and (ii) having a value one unit of said first address space different than said first address; and
   a multiplexer configured to select (i) said first data item from said memory or (ii) said first branch instruction from said logic circuit in response to said command signal.

2. The apparatus according to claim 1, wherein said memory comprises a read only memory (ROM) and a random access memory (RAM).

3. The apparatus according to claim 1, further comprising:
   a processor having (i) an address bus directly connected to said memory and said logic circuit and (ii) a data bus directly connected to said multiplexer.

4. The apparatus according to claim 1, wherein said logic circuit comprises:
   a first section configured to generate a plurality of match signals by comparing said first address to each of said predetermined addresses.

5. The apparatus according to claim 4, wherein said logic circuit further comprises:
   a second section configured to generate an indication signal in response to (i) said match signals and (ii) a difference between said first address and said second address.

6. The apparatus according to claim 5, wherein said logic circuit further comprises:
   a third section configured to generate said command signal in response to said indication signal and said match signals.

7. The apparatus according to claim 1, wherein said logic circuit comprises:
an adder configured to generate an intermediate address by adding said one unit to said first address.

8. The apparatus according to claim 7, wherein said logic circuit further comprises:
a comparator configured to compare said intermediate address with said second address.

9. The apparatus according to claim 1, wherein said memory is writeable in said second address space for storing (i) a second branch instruction and (ii) a second branch address within said first address space.

10. The apparatus according to claim 1, wherein said first address space is configured to address read only memory cells and said second address space is configured to address read and write memory cells.

11. A method for reading from a memory space comprising a first address range and a second address range, comprising the steps of:
(A) returning a first data item in response to a first address within said first address range;
(B) generating a first branch instruction in response to said first address matching one of said predetermined addresses;
(C) selecting said first data item in response to said first address not matching any of said predetermined addresses;
(D) selecting said first branch instruction in response to step (B); and
(E) returning a first branch address within said second address range in response to a second address (i) immediately following said first address and (ii) having a value one unit of said first address range different than said first address.

12. The method according to claim 11, further comprising the step of:
returning a second data item stored in said second address range in response to receiving said first branch address.

13. The method according to claim 12, further comprising the step of:
returning a second branch instruction stored in said second address range in response to receiving a third address after said first branch address.

14. The method according to claim 13, further comprising the step of:
returning a second branch address (i) within said first address range and (ii) stored in said second address range at a fourth address received after said third address.

15. The method according to claim 11, further comprising the step of:
branching a first program stored in said first address range to a second program stored in said second address range in response to said first branch instruction and said first branch address.

16. The method according to claim 11, further comprising the step of:
ignoring said first branch instruction while executing a first program stored in said first address range.

17. The method according to claim 11, wherein said first address range comprises read only and said second address range comprises read and write.

18. An apparatus for reading from a memory space comprising a first address range and a second address range, comprising:
means for returning a first data item in response to a first address within said first address range;
means for generating a first branch instruction in response to said first address matching one of said predetermined addresses;
means for generating a first branch address within a second address range and asserting a command signal in response to a second address (i) immediately following said first address and (ii) having a value one unit of said first address range different than said first address;
means for selecting said first data item in response to said first address not matching any of said predetermined addresses; and
means for selecting said first branch instruction in response to said means for generating said first branch instruction.

19. An apparatus comprising:
a memory comprising a first address space configured as read only and a second address space configured as read and write, wherein said memory returns a first data item in response to a first address within said first address space;
a logic circuit configured to (i) deassert a command signal in response to said first address not matching any of a plurality of predetermined addresses and (ii) generate a first branch instruction and assert said command signal in response to said first address matching one of said predetermined addresses in response to said matching, wherein said logic circuit includes a comparator configured to generate said command signal by comparing (i) an intermediate address generated by adding one to said first address with (ii) a second address immediately following said first address; and
a multiplexer configured to select (i) said first data item from said memory or (ii) said first branch instruction from said logic circuit in response to said command signal.

* * * * *